United States Patent
Vogt et al.

(10) Patent No.: US 6,465,324 B2
(45) Date of Patent: Oct. 15, 2002

(54) RECESSED SILICON OXIDATION FOR DEVICES SUCH AS A CMOS SOI ICS

(75) Inventors: Eric E. Vogt, Minneapolis; Cheisen J. Yue, Roseville, both of MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/681,351

(22) Filed: Mar. 23, 2001

(65) Prior Publication Data

US 2002/0135017 A1 Sep. 26, 2002

(51) Int. Cl.$^7$ .............................. H01L 21/76
(52) U.S. Cl. ................. 438/425; 438/439; 438/444
(58) Field of Search ....................... 438/424, 425, 438/439–455

(56) References Cited

U.S. PATENT DOCUMENTS

| | | | | |
|---|---|---|---|---|
| 5,254,495 A | * | 10/1993 | Lur et al. | 437/70 |
| 5,728,620 A | * | 3/1998 | Park | 438/425 |
| 5,807,784 A | * | 9/1998 | Kim | 438/423 |
| 5,972,778 A | * | 10/1999 | Hamada | 438/444 |
| 6,096,660 A | * | 8/2000 | Chapek et al. | 438/775 |
| 6,198,134 B1 | * | 3/2001 | Inoue et al. | 257/351 |
| 6,306,727 B1 | * | 10/2001 | Akram | 438/444 |

OTHER PUBLICATIONS

Author: M. Racanelli, W.M. Huang, H.C. Shin, J. Foerstner, J. Ford, H. Park, S. Cheng, T. Wetteroth, S. Hong, H. Shin and S.R. Wilson, Title: TFSOI CMOS Technology For Low Power Applications, Electrochemical Society Proceedings, vol. 96–3, pp. 422–431.

Author: T. Iwamatsu, S. Miyamoto, Y. Yamaguchi, T. Ipposhi, Y. Inoue and H. Miyoshi, Title: Study on LOCOS Isolation For Short–Channel SOI MOSFET's, Electrochemical Society Proceedings, vol. 3 96–3, pp. 318–328.

* cited by examiner

Primary Examiner—John F. Niebling
Assistant Examiner—Viktor Simkovic
(74) Attorney, Agent, or Firm—Dennis C. Bremer

(57) ABSTRACT

A method is provided to form a LOCOS isolation in a CMOS SOI device. The SOI has a top silicon layer, a bottom silicon layer, and an insulation layer between the top and bottom silicon layers. An oxide layer is formed over the top silicon layer, and an LPCVD layer is deposited over the oxide layer. A photoresist is provided over the LPCVD layer that exposes a localized area of the LPCVD layer. The LPCVD layer and the oxide layer are etched away through the localized area to expose the top silicon layer. The silicon in the top silicon layer is etched so as to form a recess in the top silicon layer. The photoresist is removed and an isolation oxide is grown over the silicon in the recess so that the silicon in the recess is fully oxidized.

20 Claims, 5 Drawing Sheets

RECESSED SILICON OXIDATION FOR DEVICES SUCH AS A CMOS SOI ICS

BACKGROUND OF INVENTION

CMOS SOI ICs (complementary metal oxide semiconductor silicon on insulator integrated circuits) have been used in a wide variety of applications. However, attempts to use CMOS SOI ICs in some applications, such as wireless applications, have proven to be unsatisfactory.

For example, GaAs has been used in RF and microwave wireless applications. However, GaAs based devices for these applications are costly and are not easily manufactured. On the other hand, CMOS SO IC processing offers the possibility of easier manufacturing and less cost resulting from integration of a system on a chip. Thus, to effectively compete with GaAs technology, the CMOS SOI manufacturing process must be more cost effective and more highly manufacturable.

Known CMOS SOI manufacturing processes, however, have not offered sufficient advantages over GaAs technology. For example, LOCOS (local oxidation of silicon) isolation and MESA isolation as shown in FIGS. 1 and 2 are processes frequently used in CMOS SOI integration. FIG. 1 shows a CMOS SOI device 10 resulting from conventional LOCOS isolation processing. The CMOS SOI device 10 has an SOI wafer 12 including a bottom silicon layer 14 forming a p-type substrate, a buried oxide insulation layer 16, and a top silicon layer 18. The CMOS SOI device 10 further includes an oxide layer 20 over the top silicon layer 18 and a field oxide 22. As can be seen, conventional LOCOS isolation does not result in global planarity. Also, it is well known that conventional LOCOS isolation results in a long birds beak at the edge of the oxidation.

FIG. 2 shows a CMOS SOI device 30 resulting from conventional MESA isolation processing. The CMOS SOI device 30 has an SOI wafer 32 including a bottom silicon layer 34 forming a p-type substrate, a buried oxide insulation layer 36, and a top silicon layer 38 forming a silicon mesa. The CMOS SOI device 10 further includes a field oxide 40. As can be seen, conventional MESA isolation results in very poor global topography making it effectively impossible to pattern CMOS gates in the sub 0.7 micron regime.

These problems have made it difficult to effectively utilize CMOS SOI ICs in RF and microwave wireless applications.

The present invention solves one or more of these or other problems by utilizing a recessed LOCOS isolation on SOI which facilitates easier and more cost effective CMOS SOI IC manufacturing.

SUMMARY OF INVENTION

In accordance with one aspect of the present invention, a CMOS SOI process comprises the following: depositing an oxide layer over a silicon layer of an SOI wafer; depositing an isolation layer over the oxide layer; selectively removing the isolation layer, the oxide layer, and a first portion of silicon in the silicon layer so that a recess is formed in the silicon layer and so that the recess is exposed through the isolation layer and the oxide layer; and, growing an isolation oxide over the recess, wherein the silicon in the recess is oxidized.

In accordance with another aspect of the present invention, a method is provided to form a LOCOS isolation in a CMOS SOI device having a top silicon layer, a bottom silicon layer, and an insulation layer between the top and bottom silicon layers. The method comprises the following: forming an oxide layer over the top silicon layer; depositing an LPCVD layer over the oxide layer; providing a photoresist over the LPCVD layer so as to expose a localized area of the LPCVD layer; etching through the localized area of the LPCVD layer to expose the oxide layer; etching through the oxide layer in the localized area to expose the top silicon layer; etching a portion of silicon in the top silicon layer so that a portion of silicon in the top silicon layer remains in localized area and defines a recess;

removing the photoresist; and, growing an isolation oxide over the silicon in the recess, wherein the silicon in the recess is oxidized.

In accordance with still another aspect of the present invention, a method of forming a LOCOS isolation for a CMOS SOI device comprises the following: etching a selected area of a silicon layer of the CMOS SOI device; terminating the etching before an insulation layer of the CMOS SOI device immediately below the silicon layer is exposed through the selected area; and, growing an isolation oxide over the selected area such that the silicon remaining in the selected area is substantially fully oxidized.

BRIEF DESCRIPTION OF DRAWINGS

These and other features and advantages will become more apparent from a detailed consideration of the invention when taken in conjunction with the drawings in which.

DETAILED DESCRIPTION

Figure 1:
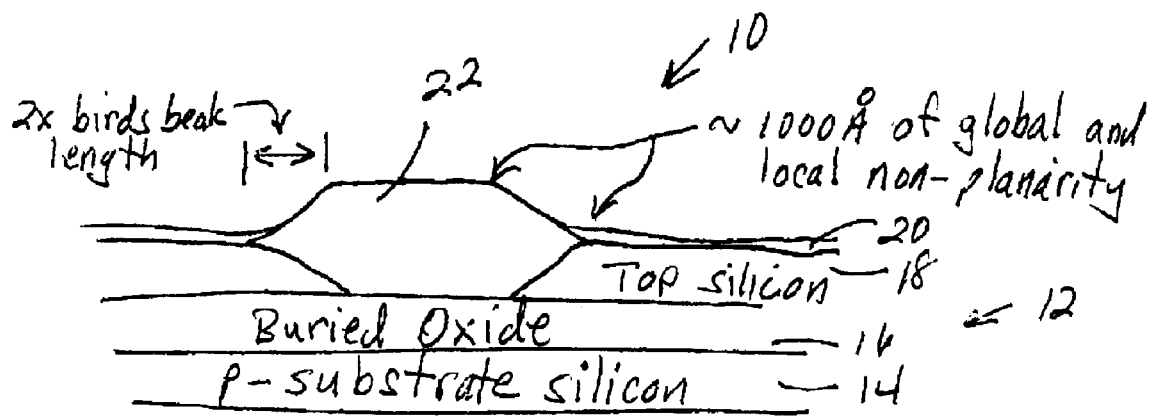
FIG. 1 is a cross sectional diagram showing a CMOS SOI device resulting from conventional LOCOS isolation processing.
Figure 2:
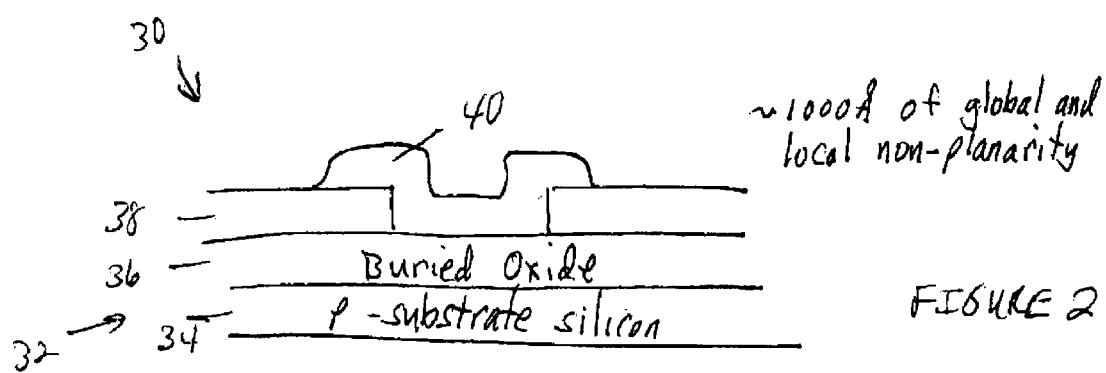
FIG. 2 is a cross sectional diagram showing a CMOS SOI device resulting from conventional MESA isolation processing.
Figure 3:
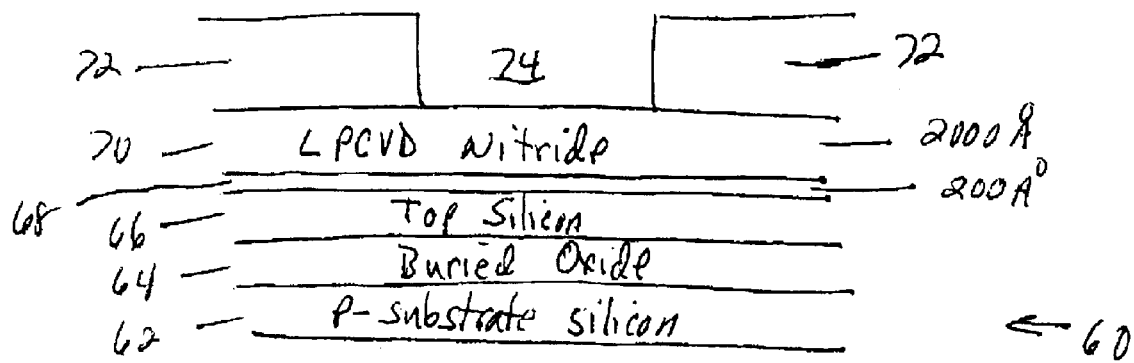
FIG. 3 is a cross sectional diagram showing an early stage in CMOS SOI processing according to an embodiment of the present invention.
Figure 4:
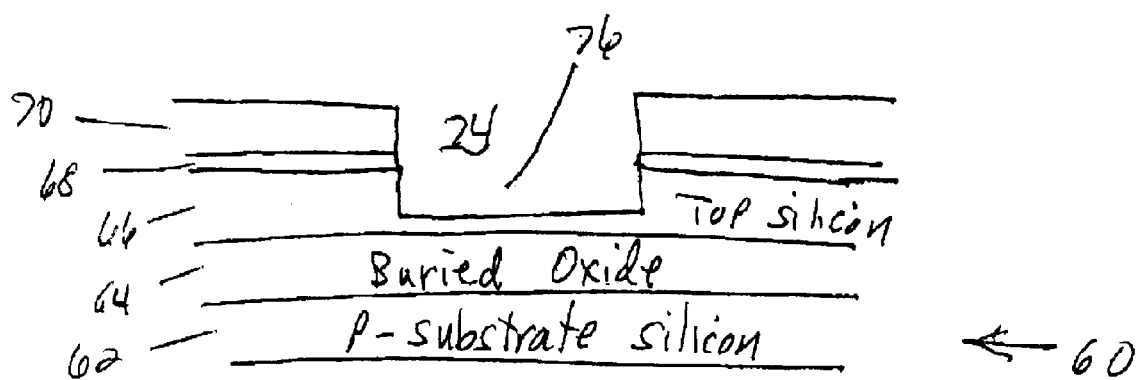
FIG. 4 is a cross sectional diagram showing a later stage in CMOS SOI processing according to the embodiment of the present invention shown in FIG. 3.
Figure 5:
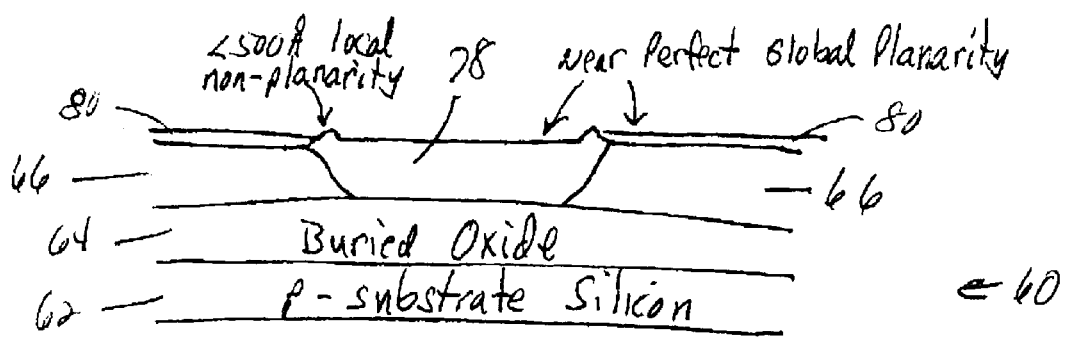
FIG. 5 is a cross sectional diagram showing a still later stage in CMOS SOI processing according to the embodiment of the present invention shown in FIG. 3.

The recessed LOCOS isolation process according to the embodiment of the present invention shown in FIGS. 3, 4, and 5 is performed early in the CMOS SOI manufacturing process. Immediately following wafer scribe, a thin oxide layer is grown on the bare silicon layer of the SOI wafer. A sacrificial LPCVD silicon nitride layer is then deposited over the thin oxide layer. The silicon nitride layer and the thin oxide layer are patterned and etched in a selective reactive ion etch (RIE) so as expose the top silicon of the SOI wafer as a field region of the CMOS SOI device. Etching is continued so that the top silicon is etched partially to leave approximately half of the top silicon. Accordingly, a recess is formed in the top silicon. A LOCOS oxidation is conducted at this recess so as to fully oxidize the remaining top silicon and so as to form a globally planar device with a birds beak that is about half the length of the birds beak resulting from conventional LOCOS isolation. The sacrificial silicon nitride and oxide layers are removed with conventional hot phosphoric and dilute HF applications, respectively.

More specifically, an SOI wafer 60 as shown in FIGS. 3, 4, and 5 includes a bottom silicon layer 62 forming a p-type substrate, a buried oxide insulation layer 64, and a top silicon layer 66. The SOI wafer 60 is scribed and cleansed as are conventional. A thin oxide layer 68 is grown over the top silicon layer 66 and is used as a sacrificial pad for the downstream recess LOCOS process. The oxide layer 68 has a thickness on the order of 200 angstroms.

An LPCVD layer 70, which may be a nitride layer such as a silicon nitride layer, is deposited over the oxide layer 68, and a field region 74 is defined by a photoresist 72 which is selectively deposited on the LPCVD layer 70. The field region 74 is the region of the top silicon layer 66 which is to be oxidized during LOCOS isolation. The photoresist 72 accordingly protects the LPCVD layer 70 and the top silicon layer 66 which lie below the photoresist 72. At this stage of the process, the 501 wafer 60 and the additional layers described above are shown in FIG. 3.

An RIE etch is performed to completely remove the portions of the LPCVD layer 70 and the oxide layer 68 in the field region 74. The RIE etch is also selective to the underlying top silicon layer 66. Thus, the RIE etch also removes a portion (such as 50%) of the top silicon layer 66 in the field region 74 defined by the photoresist 72 in preparation for the recess LOCOS oxidation. As a result of this etching, a recess 76 is formed in the top silicon layer 66 and will be oxidized during the subsequent LOCOS oxidation discussed below. The amount of the top silicon layer 66 remaining in the field region 74 dictates the field isolation topography. It is desirable to achieve flat global topography to protect against gate polysilicon streamers after gate poly RIE etching.

The photoresist 72 is removed by any suitable process, and the SOI wafer 60 and additional layers are cleansed. At this stage of the process, the SOI wafer 60 and the additional layers described above are shown in FIG. 4. FIG. 4 also shows the recess 76 discussed above.

A LOCOS oxidation is performed in the area of this recess 76. This LOCOS oxidation grows an isolation oxide 78 selectively in the areas not masked by silicon nitride. The isolation oxide 78 provides complete isolation between the p-tub and n-tub areas of the top silicon layer 66. Recessed LOCOS oxidation improves global topography allowing minimum gate poly over-etch.

At this point, the thin layer of oxide which forms above the LPCVD layer 70 during the LOCOS oxidation is etched away. The LPCVD layer 70 is also stripped away. Because the previous oxide layer 68 usually becomes too thin as a result of the stripping of the LPCVD layer 70, the oxide layer 68 is also stripped and is replaced by a new oxide layer 80. The final thickness of the oxide layer 80 is of critical importance for threshold voltage control. The oxide layer 80 should preferably be on the order of 200 angstroms. The oxide layer 80 is also used as the gate oxide in a power device and a high performance LDMOS device. The device is again cleansed and the resulting structure is shown in FIG. 5.

The invention as described above provides several distinct advantages over other isolation processes such as conventional LOCOS isolation, MESA isolation, etc. These advantages include the following: i) a shorter and more cost effective isolation process flow; ii) global planarization that allows patterning of CMOS gate lengths in the deep (0.25) submicron regime; and, iii) minimization of encroachment of the LOCOS birds beak compared to conventional LOCOS processes without sacrificing process simplicity. Indeed, conventional LOCOS isolation results in a birds beak length twice that of the process described above. MESA isolation results in very poor global topography making it impossible to pattern CMOS gates in the sub 0.7 micron regime.

Certain modifications of the present invention will occur to those practicing in the art of the present invention. Accordingly, the description of the present invention is to be construed as illustrative only and is for the purpose of teaching those skilled in the art the best mode of carrying out the invention. The details may be varied substantially without departing from the spirit of the invention, and the exclusive use of all modifications which are within the scope of the appended claims is reserved.

What is claimed is:

1. A CMOS SOI process comprising:
   forming an oxide layer over a top silicon layer of an SOI wafer;
   forming an isolation layer over the oxide layer;
   selectively removing a portion of the isolation layer, a portion of the oxide layer, and a portion of the top silicon layer directly following the forming of the isolation layer, whereby a recess is formed in the top silicon layer; and,
   oxidizing the silicon in the recess to form an isolation oxide in the top silicon layer.

2. The CMOS SOI process of claim 1 wherein the oxide layer has a thickness of approximately 200 angstroms.

3. The CMOS SOI process of claim 1 wherein the isolation layer has a thickness of approximately 200 angstroms.

4. The CMOS SOI process of claim 1 further comprising removing the isolation layer following oxidizing of the silicon in the recess.

5. The CMOS SOI process of claim 4 further comprising removing the oxide layer following removing of the isolation layer.

6. The CMOS SOI process of claim 5 further comprising growing a replacement oxide layer over the top silicon layer following removing of the oxide layer, wherein the replacement oxide layer has a thickness of approximately 200 angstroms.

7. The CMOS SOI process of claim 1 wherein the oxidizing of the silicon in the recess results in a layer of oxide formed over the isolation layer, and wherein the CMOS SOI process further comprises removing the oxide layer formed over the isolation layer.

8. The CMOS SOI process of claim 7 further comprising removing the isolation layer following oxidizing of the silicon in the recess.

9. The CMOS SOI process of claim 8 further comprising removing the oxide layer following removing of the isolation layer.

10. The CMOS SOI process of claim 9 further comprising growing a replacement oxide layer over the top silicon layer following removing of the oxide layer, wherein the replacement oxide layer has a thickness of approximately 200 angstroms.

11. The CMOS SOI process of claim 1 wherein the isolation layer comprises a silicon nitride layer.

12. A CMOS SOI process comprising:
   forming an oxide layer over a top silicon layer of an SOI wafer;
   forming an isolation layer over the oxide layer;
   selectively removing a portion of the isolation layer, a portion of the oxide layer, and a portion of the top silicon layer without the use of sidewalls, whereby a recess is formed in the top silicon layer;
   oxidizing the silicon in the recess to form an isolation oxide in the top silicon layer; and, removing the isolation layer directly following oxidizing of the silicon on the recess.

13. The CMOS SOI process of claim 12 wherein the oxide layer has a thickness of approximately 200 angstroms.

14. The CMOS SOI process of claim 12 wherein the isolation layer has a thickness of approximately 200 angstroms.

15. The CMOS SOI process of claim 12 further comprising removing the oxide layer following removing of the isolation layer.

16. The CMOS SOI process of claim 15 further comprising growing a replacement oxide layer over the top silicon layer following removing of the oxide layer, wherein the replacement oxide layer has a thickness of approximately 200 angstroms.

17. The CMOS SOI process of claim 12 wherein the oxidizing of the silicon in the recess results in a layer of oxide formed over the isolation layer, and wherein the CMOS SOI process further comprises removing the oxide layer formed over the isolation layer.

18. The CMOS SOI process of claim 17 further comprising removing the oxide layer.

19. The CMOS SOI process of claim 18 further comprising growing a replacement oxide layer over the top silicon layer following removing of the oxide layer, wherein the replacement oxide layer has a thickness of approximately 200 angstroms.

20. The CMOS SOI process of claim 12 wherein the isolation layer comprises a silicon nitride layer.

* * * * *